(12) United States Patent
Kakkar

(10) Patent No.: US 11,674,795 B2
(45) Date of Patent: Jun. 13, 2023

(54) MINIATURE PATTERN PROJECTOR USING MICROLEDS AND MICRO-OPTICS

(71) Applicant: Lumileds LLC, San Jose, CA (US)

(72) Inventor: Varun Dev Kakkar, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 107 days.

(21) Appl. No.: 17/125,171

(22) Filed: Dec. 17, 2020

(65) Prior Publication Data

US 2021/0190481 A1 Jun. 24, 2021

Related U.S. Application Data

(60) Provisional application No. 62/949,907, filed on Dec. 18, 2019.

(51) Int. Cl.

| | |
|---|---|
| *G01B 11/25* | (2006.01) |
| *H01L 25/075* | (2006.01) |
| *H01L 33/30* | (2010.01) |
| *H01L 33/32* | (2010.01) |
| *H01L 33/58* | (2010.01) |
| *H01L 33/62* | (2010.01) |
| *G06V 10/145* | (2022.01) |

(52) U.S. Cl.
CPC .......... *G01B 11/2513* (2013.01); *G01B 11/25* (2013.01); *H01L 25/0753* (2013.01); *H01L 33/30* (2013.01); *H01L 33/32* (2013.01); *H01L 33/58* (2013.01); *H01L 33/62* (2013.01); *G06V 10/145* (2022.01); *H01L 2933/0058* (2013.01); *H01L 2933/0066* (2013.01)

(58) Field of Classification Search
CPC ..... G01B 11/25; H01L 25/0753; H01L 33/30; H01L 33/32; H01L 33/58; H01L 33/62; H01L 2933/0058; H01L 2933/0066
See application file for complete search history.

(56) References Cited

U.S. PATENT DOCUMENTS

| | | |
|---|---|---|
| 6,410,942 B1 | 6/2002 | Thibeault et al. |
| 6,657,236 B1 | 12/2003 | Thibeault et al. |
| 6,821,804 B2 | 11/2004 | Thibeault et al. |
| 9,109,296 B2 | 8/2015 | Metaye et al. |
| 9,192,290 B2 | 11/2015 | Spinnler et al. |
| 9,496,465 B2 | 11/2016 | Sugimoto et al. |
| 9,507,204 B2 | 11/2016 | Pelka et al. |
| 9,722,160 B2 | 8/2017 | Nakabayashi |

(Continued)

FOREIGN PATENT DOCUMENTS

| | | |
|---|---|---|
| EP | 2499958 A1 | 9/2012 |
| FR | 2952366 A1 | 5/2011 |

(Continued)

*Primary Examiner* — Tracie Y Green
(74) *Attorney, Agent, or Firm* — Servilla Whitney LLC

(57) ABSTRACT

An apparatus projecting light onto a projection surface comprises: a substrate having disposed thereon two or more LED clusters and two or more micro-lenses, each LED cluster comprising a plurality of LEDs and each of the micro-lenses being disposed the plurality of LEDs. Each of the LED clusters is arranged to emit light through each of the micro-lenses in a pattern of dots. A center of at least one LED cluster is off-set from an optical center of the micro-lens of its LED cluster. A projected image includes arrangements of individual dots and/or areas of smooth light resulting from the pattern of dots.

20 Claims, 8 Drawing Sheets

(56) References Cited

U.S. PATENT DOCUMENTS

| | | |
|---|---|---|
| 10,018,325 B2 | 7/2018 | Kim et al. |
| 10,050,026 B2 | 8/2018 | Takeya et al. |
| 10,811,460 B2 | 10/2020 | Dimitropoulos et al. |
| 10,923,628 B2 | 2/2021 | Dimitropoulos et al. |
| 10,964,845 B2 | 3/2021 | Dimitropoulos et al. |
| 11,425,343 B2 * | 8/2022 | Osmanis ............... H04N 9/3152 |
| 2004/0223337 A1 * | 11/2004 | Ishida .................... F21S 41/155 257/E33.059 |
| 2004/0223342 A1 * | 11/2004 | Klipstein ................ G01N 21/91 362/555 |
| 2008/0106897 A1 * | 5/2008 | Yoon ..................... G02B 3/0056 359/628 |
| 2013/0020115 A1 | 1/2013 | Mataye et al. |
| 2014/0071404 A1 * | 3/2014 | Davidson ................ G01B 11/25 353/30 |
| 2015/0228873 A1 | 8/2015 | Gebuhr et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2017/0098746 A1 | 4/2017 | Bergmann et al. |
| 2017/0243860 A1 | 8/2017 | Hong et al. |
| 2018/0017939 A1 | 1/2018 | Allier et al. |
| 2018/0073873 A1 * | 3/2018 | Takao ..................... G01S 17/48 |
| 2018/0145059 A1 | 5/2018 | Welch et al. |
| 2018/0156406 A1 | 6/2018 | Feil et al. |
| 2018/0238511 A1 | 8/2018 | Hartmann et al. |
| 2018/0259570 A1 | 9/2018 | Henley |
| 2018/0272605 A1 | 9/2018 | Gmeinsieser et al. |
| 2018/0306398 A1 * | 10/2018 | Rayer .................... F21S 41/143 |

FOREIGN PATENT DOCUMENTS

| | | |
|---|---|---|
| FR | 2972815 A1 | 9/2012 |
| WO | 2016079505 A1 | 5/2016 |
| WO | 2017102708 A1 | 6/2017 |
| WO | 2018159977 A1 | 9/2018 |

\* cited by examiner

MINIATURE PATTERN PROJECTOR USING MICROLEDS AND MICRO-OPTICS

TECHNICAL FIELD

Embodiments of the disclosure generally relate to light emitting diode devices, in particular microLED (uLED or μLED) devices, and methods of manufacturing the same. The present disclosure relates generally to pattern projection technology and, more specifically, to a miniature pattern projector implemented using LEDs and micro-optics, including micro-lenses. Apparatuses include two or more LED clusters and two or more micro-lenses, and in particular include an off-set arrangement such that a center of at least one LED cluster is off-set from an optical center of the micro-lens of its LED cluster. A resulting projected image or beam of light includes individual dots and/or areas of smooth light.

BACKGROUND

A light emitting diode (LED) is a semiconductor light source that emits light when current flows through it. LEDs typically emit visible light and are constructed to emit red, blue, and green wavelengths. LEDs may further include a down-converter material, e.g. a phosphor material, to modify wavelengths and resulting colors being emitted. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

Various emerging display applications, including wearable devices head-mounted, and large-area displays require miniaturized chips composed of arrays of LEDs, e.g., microLEDs, with a high density having a lateral dimension down to less than 100 μm×100 μm. Suitable LEDs for these purposes typically have dimensions of about 50 μm in diameter or width and smaller that are used in the manufacture of color displays by aligning in close proximity LEDs comprising red, blue and green wavelengths. The LEDs implement individual pixels of the display.

Compared to LCD displays, LED displays offer improved contrast, response times, and energy efficiency. OLED and LED displays may be advantageously used to implement small, low-energy devices, such as smartwatches and smartphones, for example. OLED and LED technology both offer greatly reduced energy requirements compared to conventional LCD displays while simultaneously offering a high contrast ratio. Unlike OLED, embodiments of LEDS, in particular microLEDs, are based on indium gallium nitride ("InGaN") and/or aluminum indium gallium phosphide (AlInGaP) LED technology, which offers a far greater (e.g., up to 30 times greater) total brightness than OLED, as well as higher efficiency (which may be expressed in cd/W, c/A, nits/W, or nits/A) and lower power consumption than OLED. Unlike microLED, OLED also suffers from screen burn-in.

Dot projectors for projecting or emitting a grid or random pattern of small dots onto a surface (such as a user's face) may be employed in combination with 3D sensing algorithms to implement depth-sensing and/or facial recognition applications. Dot-projectors implemented based on vertical-cavity surface-emitting laser ("VCSEL") technology may be too expensive and cost prohibitive and overly complex for certain applications. Moreover, VCSEL technology is difficult to achieve for space constrained applications.

Facial recognition systems may be implemented with a dot projector that projects or emits a grid or random pattern of small dots onto a surface (such as a user's face) and a sensing module that receives the resulting pattern and generates a 3D map therefrom. The 3D map is compared one or more recognized faces to determine an identity of a user if the 3D map matches one of the recognized faces. Such systems can typically recognize faces with glasses, clothing, makeup, and facial hair, and may adapt to changes in appearance over time.

There is a need to provide dot projectors for thin applications such as mobile phones, handheld devices, and devices where there are space-constraints. There is also a need to simplify design and manufacture of dot projectors.

SUMMARY

Apparatuses herein include two or more LED clusters and two or more micro-lenses, and in particular include an off-set arrangement, and in particular such that a center of at least one LED cluster is off-set from an optical center of the micro-lens of its LED cluster. A resulting projected image or beam of light includes individual dots and/or areas of smooth light. Different LED clusters may be individually addressable and/or controllable and/or illuminable. With individually addressed and/or controlled LED and/or LED clusters, different LED clusters may be illuminated individually, providing an option of switching individual tiles on and off as-desired. LED clusters may be monolithic arrays or matrixes.

In a first aspect, an apparatus for projecting light onto a projection surface comprises: a substrate having disposed thereon two or more LED clusters, each LED cluster comprising a plurality of LEDs and a micro-lens disposed over the plurality of LEDs; and each of the LED clusters being arranged to emit light through each of the micro-lenses in a pattern of dots, and a center of at least one LED cluster is off-set from an optical center of the micro-lens of its LED cluster.

In a second aspect, an apparatus for projecting light onto a projection surface comprises: a LED dot projector module comprising: a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots, and a center of at least one LED cluster is off-set from an optical center of the micro-lens of its LED cluster; a sensing module for detecting the pattern of dots; and a 3D sensing application for processing the detected pattern of dots to determine at least one 3D feature of the surface.

A third aspect provides a method of projecting light onto a projection surface, the method comprising: activating an apparatus comprising: a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots, and a center of at least one LED cluster is off-set from an optical center of the micro-lens of its LED cluster; projecting the pattern of dots onto the surface; detecting the projected pattern of dots; and determining at least one 3D feature of the surface using the detected projected pattern of dots.

A further aspect is a method of making an apparatus comprising: placing a plurality of LEDS on a substrate in two or more LED clusters; and arranging a plurality of micro-lenses over each of the two or more LED clusters, each of the micro-lenses having an optical center; a center of at least one of the LED clusters being off-set from the optical center of the micro-lens of its LED cluster.

Additionally, an illumination system comprises: an array of two or more independently controllable light emitting diode (LED) clusters on a substrate; and two or more micro-lenses, each positioned over the two or more LED clusters, each of the micro-lenses having an optical center; each of the LED clusters being arranged to emit light through each of the micro-lenses in a pattern of dots, and a center of at least one LED cluster is off-set from an optical center of the micro-lens of its LED cluster.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiment's. The embodiments as described herein are illustrated by way of example and not limitation in the figures of the accompanying drawings in which like references indicate similar elements. The figures herein are not to scale.

DETAILED DESCRIPTION

Figure 1:
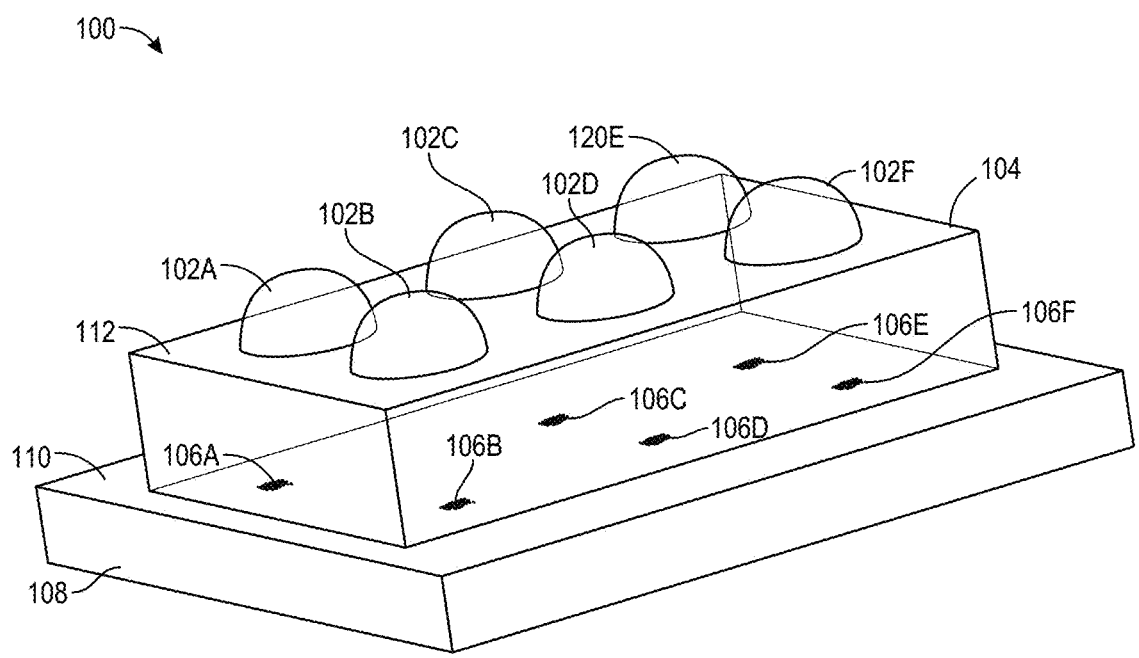
FIG. 1 is a perspective view of an apparatus in accordance with embodiments described herein.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating the disclosures described herein, it might be useful to understand phenomena that may be relevant to various embodiments thereof. The following foundational information may be viewed as a basis from which the present disclosure may be properly explained. Such information is offered for purposes of explanation only and, accordingly, should not be construed in any way to limit the broad scope of the present disclosure and its potential applications.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AN, InN and alloys), metal alloys, and other conductive materials, depending on the application. Substrates include, without limitation, light emitting diode (LED) devices, including uLED devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Reference to LED refers to a light emitting diode that emits light, which may be visible or infrared, when current flows through it. LEDs on the order microns are particularly suited for use in emerging display applications. In embodiments, the LEDs do not require an encapsulation layer. In one or more embodiments, the LEDs herein are indium gallium nitride (InGaN)-based and/or aluminum indium gallium phosphide (AlInGaP)-based. In one or more embodiments, the LEDs herein comprise red, blue and/or green wavelengths, thereby emitting visible light. In one or more embodiments, the LEDs emit infrared light.

In one or more embodiments, the LEDs herein have one or more characteristic dimensions (e.g., height, width, depth, thickness, etc. dimensions) in a range of greater than or equal to 2 micrometers to less than or equal to 500 micrometers, including all values and subranges therebetween, including greater than or equal to 30 micrometers to less than or equal to 500 micrometers. In some instances, the LEDs are referred to as microLEDs (uLEDs or μLEDs), referring to a light emitting diode having one or more characteristic dimensions (e.g., height, width, depth, thickness, etc. dimensions) on the order of micrometers or tens of micrometers. In one or more embodiments, microLEDS have one or more characteristic dimensions of less than 100 micrometers, or less than 75 micrometers. In one or embodiments, one or more dimensions of height, width, depth, thickness have values in a range of 2 to less than 75 micrometers, for example from 2 to 50 micrometers, or from 2 to 25 micrometers. Reference herein to micrometers allows for variation of ±10%.

Reference to a LED display, in particular, a microLED display (uLED display or μLED display), means an emissive display implemented using one or more arrays of LEDs, in particular microLEDs, or LED devices, in particular microLED devices, in which emissive or light-emitting elements, or pixels, are also the light source. Emissive display technologies of one or more embodiments herein do not require a separate backlight layer, enabling them to be thinner than traditional LCDs.

Reference to micro-optics, including micro-lenses, refers to structures having characteristic dimensions on the order of tens or hundreds of micrometers, which are sized to accommodate LED clusters underneath.

Embodiments of the present disclosure provide an apparatus for projecting light onto a projection surface, the apparatus comprising: a substrate having disposed thereon two or more LED clusters, each LED cluster comprising a plurality of LEDs and a micro-lens disposed over the plurality of LEDs; and each of the LED clusters being arranged to emit light through each of the micro-lenses in a pattern of dots. In one or more embodiments, a center of at least one LED cluster is off-set from an optical center of the micro-lens of its LED cluster. In one or more embodiments, a center of each LED cluster is off-set from an optical center of the micro-lens of its LED cluster. In one or more embodiments, each of the micro-lens is be disposed on a top surface of a transparent plate and a bottom surface of the transparent plate opposite the top surface rests on a top surface of the substrate. In certain embodiments, the micro-lenses are integrated into the top surface of the transparent plate.

The transparent plate may include at least one cavity on a bottom surface thereof for receiving the at least one LED cluster and the bottom surface of the transparent plate may comprise a focal point of the at least one micro-lens. In certain embodiments, the substrate comprises a printed circuit board (PCB). In one or more embodiments, for each of the plurality of LED clusters, when the LEDs of the microLED cluster are illuminated, the associated micro-lenses may project a tile of dots onto the surface.

In some embodiments, the pattern comprises a fixed pattern while in other embodiments, each of the LEDs is individually illuminable and the pattern comprises a dynamic pattern. The LEDs may comprise at least one of indium gallium nitride (InGaN) LEDs and aluminum indium gallium phosphide (AlInGaP) LEDs. Additionally, a height of the apparatus may be 4 millimeters or less.

Embodiments disclosed herein may further provide an apparatus comprising a LED dot projector module that includes a substrate having disposed thereon two or more LED clusters, each comprising a plurality of LEDs and a micro-lens disposed over each LED cluster. In one or more embodiments, the micro-lens comprises a projection lens for projecting light emitted by the plurality of LEDs. The apparatus may further include a sensing module for detecting the pattern of dots projected onto the surface; and a 3D sensing application for processing the detected pattern of dots to determine at least one 3D feature of the surface.

Embodiments disclosed herein may still further provide a method including projecting a pattern of dots onto a surface using a projector comprising a substrate having disposed thereon two or more microLED clusters, each comprising a plurality of LEDs and a micro-lens disposed over each LED cluster. In one or more embodiments, the micro-lens comprises a projection lens for projecting light emitted by the plurality of LEDs of the two or more LEDs cluster onto the surface. The method may further include detecting the projected pattern; and determining at least one 3D feature of the surface using the detected projected pattern. In certain embodiments, the pattern is a fixed pattern, whereas in other embodiments, the pattern is a dynamic pattern.

Embodiments disclosed herein may be particularly advantageous for providing a miniature dot, or pattern, projector comprising a module including microLED clusters on a printed circuit board (PCB) are overlaid with micro-optics, or micro-lenses, are disposed on a transparent plate to enable thinner applications. In certain embodiments, the microLEDs comprising the microLED clusters are fabricated from indium gallium nitride (InGaN) or aluminum indium gallium phosphide (AlInGaP).

As will be appreciated by one skilled in the art, aspects of the present disclosure, in particular aspects of a microLED dot projector described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing display systems and/or their controllers, etc.) or be stored upon manufacturing of these devices and systems.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope of the present disclosure. In certain cases, it may be easier to describe one or more of the functionalities of a given set of flows by only referencing a limited number of electrical elements.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

Advantageously, the apparatuses herein provide excellent light projection utilizing a small amount of space. In one or more embodiments, the apparatus is a miniature pattern projector module for projecting light onto a projection surface. In one or more embodiments, a height of the miniature pattern projector module is approximately 1-2 mm. In one or more embodiments, the apparatuses comprise a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots. The pattern of dots is achieved by an arrangement of off-setting a center of at least one LED cluster relative to an optical center of the lens such that the projecting LED cluster is not in the center of the projected beam of light, but is off-set from the center. In one or more embodiments, a projected beam of light or image includes arrangements of individual dots and/or areas of smooth light. The projected image pattern results from a combination of configuration and dimensions of the LEDs and micro-lenses and location of the projector relative to the projection surface.

In accordance with features of embodiments described herein, each micro-lens projects a tile of light, resulting in a random (designed as per application) pattern of dots resulting from illuminated uLEDs projecting through each of the micro-lenses. The projected tiles from micro-lenses combine to fill up a designated field of view (FOV). A low cost module solution can be accomplished by placing all LED clusters on a substrate, such as a printed circuit board (PCB) with projection optics placed on top. In a passive embodiment, the LEDs of the clusters may be placed all in series or all in parallel to implement a fixed, or static, pattern. Alternatively, in a dynamic embodiment, different LED clusters may be addressed and illuminated individually, providing the option of switching individual tiles on and off as desired. Additionally, individual LEDs of the clusters may also be made individually addressable and illuminable, thereby to enable another form of dynamic pattern projection. In yet another embodiment, rather than being used in connection with a 3D sensing application, the micro-projector, or dot projector, may be configured to project a fixed regular pattern, such as a company's logo, on a surface.

In some embodiments, a width of each of the LEDs include light emitting diodes sized between 2 microns and 500 microns. In some embodiments, a width of each of the LEDs include light emitting diodes sized between 30 microns and 300 microns. Reference to width is that as measured at the widest point. In some embodiments, pixels can be square, rectangular, hexagonal, or have curved perimeter. Pixels can be of the same size, of differing sizes, or similarly sized and grouped to present larger effective pixel size.

The LED clusters can be monochromatic, a combination of red, green, and blue (RGB) pixels, or other desired chromaticity. In one or more embodiments, the LED clusters create an array or matrix of pixels on the substrate. In one or more embodiments, an array or matrix comprises two or more independently controllable light emitting diode (LED) clusters on a substrate. In one or more embodiments, a monolithic array or matrix comprises two or more independently controllable light emitting diode (LED) clusters on a substrate. Reference to independently controllable LED clusters means that each cluster, or groups of clusters, can be separately controlled.

In one or more embodiments, each of the LED clusters comprise an array or a plurality of independently controllable LEDs. In one or more embodiments, each of the LED clusters comprise a monolithic array or a plurality of independently controllable LEDs. Reference to independently controllable LEDs means that each LED pixel, or groups of LEDs, of the cluster can be separately controlled.

To reduce overall data management requirements, control can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of light emitters in the pixel array being separately controllable despite having common pixels depending on lighting requirements. In one embodiment, intensity can be separately controlled and adjusted by setting appropriate ramp times and pulse width for each pixel using a pulse width modulation. This allows staging of pixel activation to reduce power fluctuations, and to provide superior luminous intensity control.

By placing LEDs in random, irregular, and/or logo/image formations can be used with projection optics (e.g., a single projection lens) to project dots onto a surface and yielding projected images including arrangements of individual dots and/or areas of smooth light. In one or more embodiments, a center of at least one LED clusters is off-set from an optical center of a corresponding micro-lens such that light projecting therefrom is a pattern of dots, and not a single beam of light. In one or more embodiments, a center of each LED cluster is off-set from an optical center of the micro-lens of its LED cluster. An optical center of a lens is a point on an axis of the lens that is located such that any ray of light passing through it in passing through the lens suffers no net deviation. Embodiments described herein may reduce cost, complexity, and height of dot projection systems, thereby facilitating their use in mobile phone and other handheld device applications.

Referring now to FIG. 1, illustrated therein is a perspective view of an exemplary apparatus 100 in accordance with embodiments described herein. As shown in FIG. 1, the apparatus 100 comprises a substrate 108, two or more (a plurality of) LED clusters 106A-106F, and two or more (a plurality) of micro-lenses 102A-102F on a transparent plate 104. The LED clusters 106A-106F are disposed on a top surface 110 of the substrate 108. In one or more embodiments, the substrate 108 is a printed circuit board (PCB) 108. A bottom surface (not numbered in FIG. 1) of the transparent plate 104 is on the top surface 110 of the substrate 108. In one or more embodiments, the height of the module 100 is greater than or equal to 0.5 mm to less than or equal to 4 mm, including all values and subranges therebetween, including greater than or equal to 1 mm to less than or equal to 2 mm. In one or more embodiments, each of the micro-lenses 102A-102E is a projection lens. As depicted in FIG. 1, each of the plurality of micro-lenses 102A-102E is disposed on or in and/or extends from a top surface 112 of the transparent plate 104, the top surface 112 being opposite the bottom surface of the transparent plate 104. In one or more embodiments, each of the micro-lenses is integral to the top surface 112 of the transparent plate 104.

In an embodiment, the apparatus 100 is a LED dot projector module for projecting light onto a projection surface, the module comprising: a substrate having disposed thereon two or more LED clusters, each LED cluster comprising a plurality of LEDs and a micro-lens disposed over the plurality of LEDs; and each of the LED clusters being arranged to emit light through each of the micro-lenses in a pattern of dots, and a center of at least one LED cluster is off-set from an optical center of the micro-lens of its LED cluster.

In an embodiment, the apparatus 100 is an illumination system comprising: an array of two or more independently controllable light emitting diode (LED) clusters on a substrate; and two or more micro-lenses, each positioned over the two or more LED clusters, each of the micro-lenses having an optical center; each of the LED clusters being arranged to emit light through each of the micro-lenses in a pattern of dots, and a center of at least one LED cluster is off-set from an optical center of the micro-lens of its LED cluster.

In an embodiment, the apparatus 100 is an illumination system comprising: a monolithic array of two or more independently controllable light emitting diode (LED) clusters on a substrate; and two or more micro-lenses, each positioned over the two or more LED clusters, each of the micro-lenses having an optical center; each of the LED clusters being arranged to emit light through each of the micro-lenses in a pattern of dots, and a center of at least one LED cluster is off-set from an optical center of the micro-lens of its LED cluster.

Figure 2A:
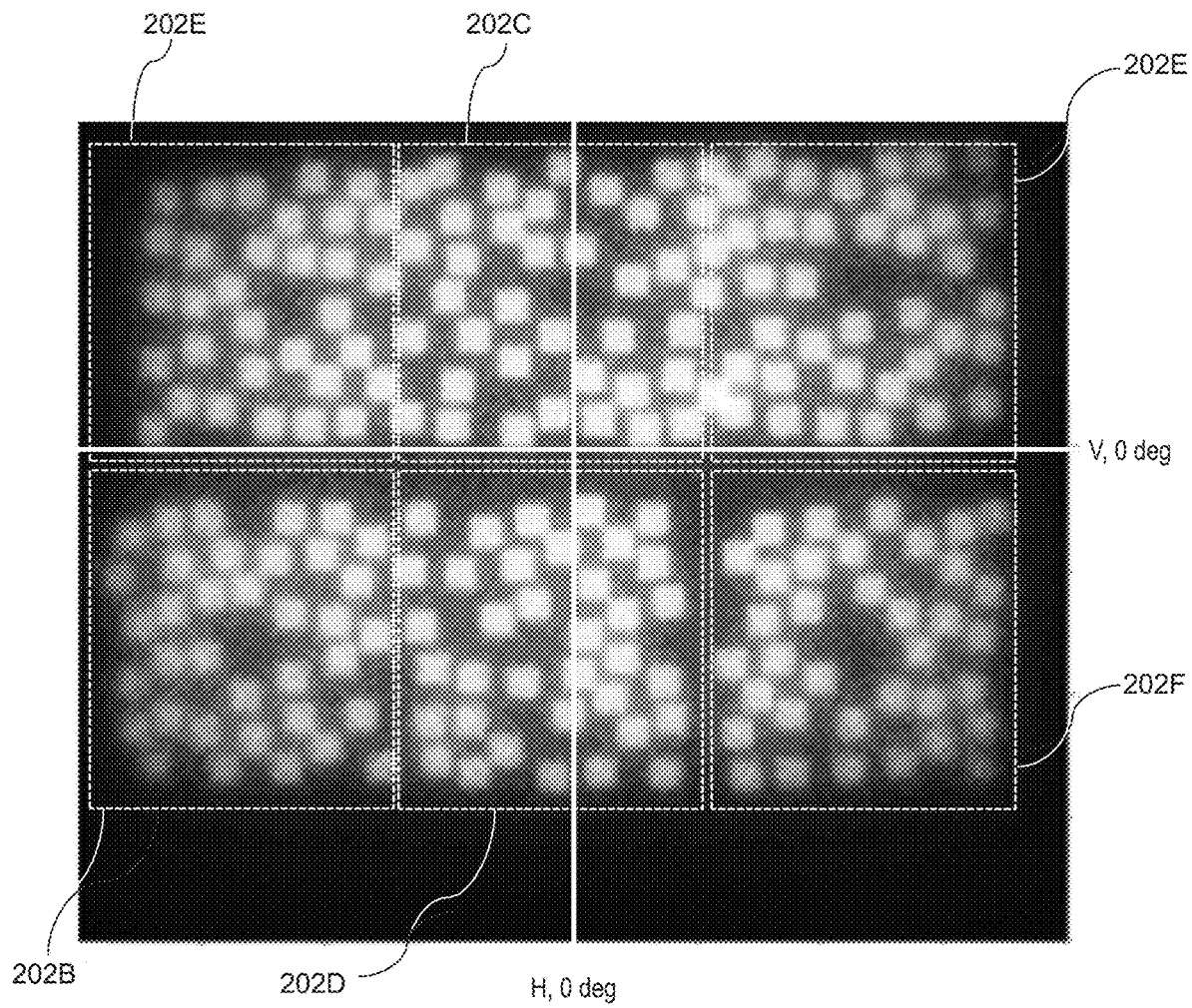
FIG. 2A is a photograph a simulated light pattern projected by an exemplary LED dot projector module onto a surface of interest depicting intensity and including "H" and "V" axes with units of degrees.
Figure 2B:
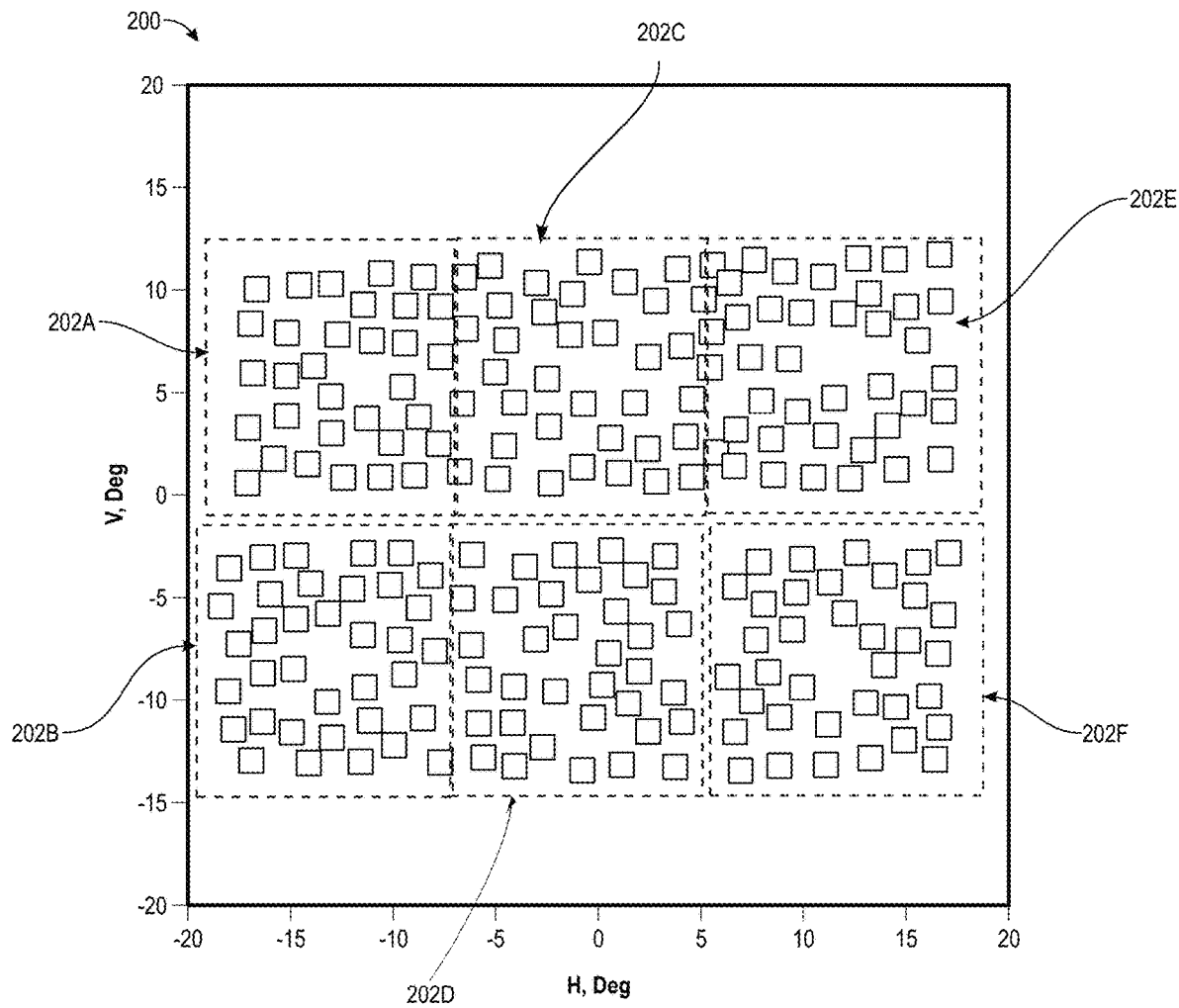
FIG. 2B illustrates a line drawing of the simulated light pattern of FIG. 2A including a detailed graph of degrees.

As shown in FIG. 2A, which is a photograph of a simulated light pattern projected by the LED dot projector module of FIG. 1 onto a surface of interest depicting intensity and including "H" (horizontal) and "V" (vertical) axes of degrees, and in FIG. 2B, which illustrates a line drawing of the simulation of FIG. 2A, wherein a pattern 200 projected by the module 100, every micro-lens 102A-102F (FIG. 1) projects a tile of light 202A-202F originating from a random (designed as per the application) pattern of dots resulting from illuminated LEDs projecting through each of the micro-lenses. In the illustrated embodiment, the micro-lenses 102A-102F are arranged such that the tiles 202A-202F align with one another to fill up an entire field of view ("FOV") of the projector. In FIGS. 2A-2B, annotation of tiles 202A-202F is approximated by dotted lines. In FIGS. 2A-2B, some of the individual dots span two tiles (e.g., between 202C and 202E). In practice, the tiles may or may not overlap depending on the application requirement. The various tiles are expected to vary in intensity. The various dots making up the tiles are also expected to vary in intensity. The simulation of FIG. 2A is based on ray-tracing algorithms used in computer-aided design.

In the embodiment illustrated in FIGS. 1 and 2A-2B, each cluster 106 includes 6×6 array of microLEDs, for a total of 36 microLEDs per cluster, or 36 "dots" per tile 202A. The clusters 106 are arranged in two rows of three clusters each, creating a pattern of 18 wide by 12 high dots. It should be noted, however, that the clusters and the microLEDs within a cluster may be arranged in a variety of ways; the embodiment illustrated in FIGS. 1 and 2A-2B is for illustrative purposes only. In one or more embodiments, a thickness of the plate 104 is designed such that a bottom plane of the plate functions as focal point of the micro-lenses, which in turn function as micro-projection lenses for each of the microLED clusters 106A-106F. To be discussed with respect to FIG. 4, the bottom surface or plane of the plate may comprise cavities, which are accounted for in designing the focal point. The microLED clusters 106A-106F are each placed at the focal point of the corresponding micro-lenses 102A-102F, and shifted spatially so that each of their centers is optically off-set from the focal point so that a pattern of dots is emitted off-set from center (rather than a pattern of dots in the center of a beam of light). As depicted in FIGS. 2A-2B, each of the LED clusters is off-set from the optical center if its corresponding micro-lens.

Figure 9:
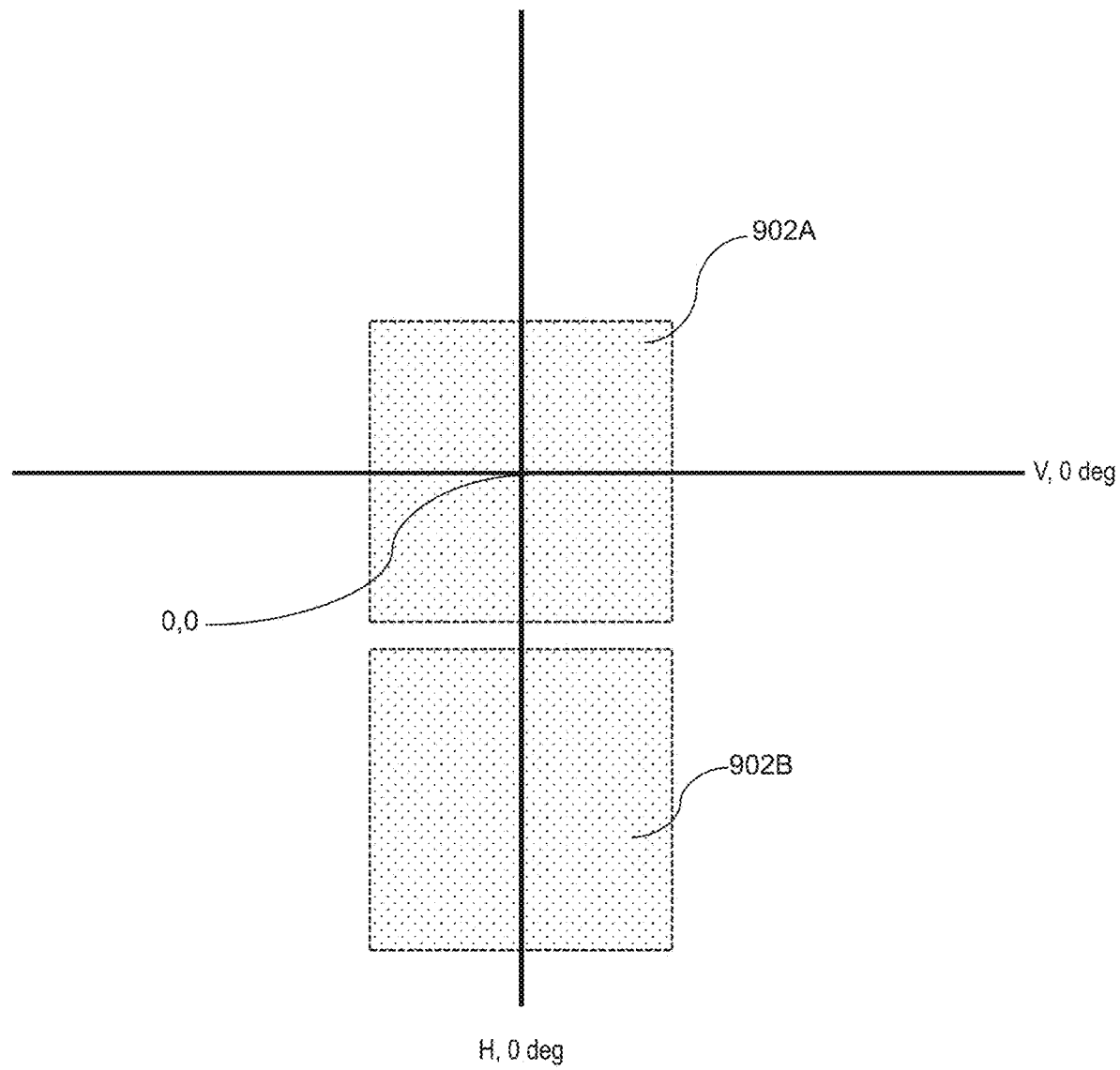
FIG. 9 illustrates a line drawing of a light pattern for an embodiment where at least one LED cluster is off-set from an optical center of its lens.

FIG. 9 discloses an embodiment where a center of just one LED cluster is off-set from an optical center of the micro-lens of its LED cluster. A center of an LED cluster emitting light tile 902A aligns with an optical center of its micro-lens, and its projected dot pattern tile has center at (0,0) of H and V axis of a projected plane as shown in FIG. 9. A LED cluster emitting light tile 902B is off-set from an optical center and not exactly on the focal point of the projection lens to blur the projected dots and merge them together to form uniform projection instead of dots. Light tile 902B projects next to light tile 902A to fill up a projection space (FOV).

Figure 3:
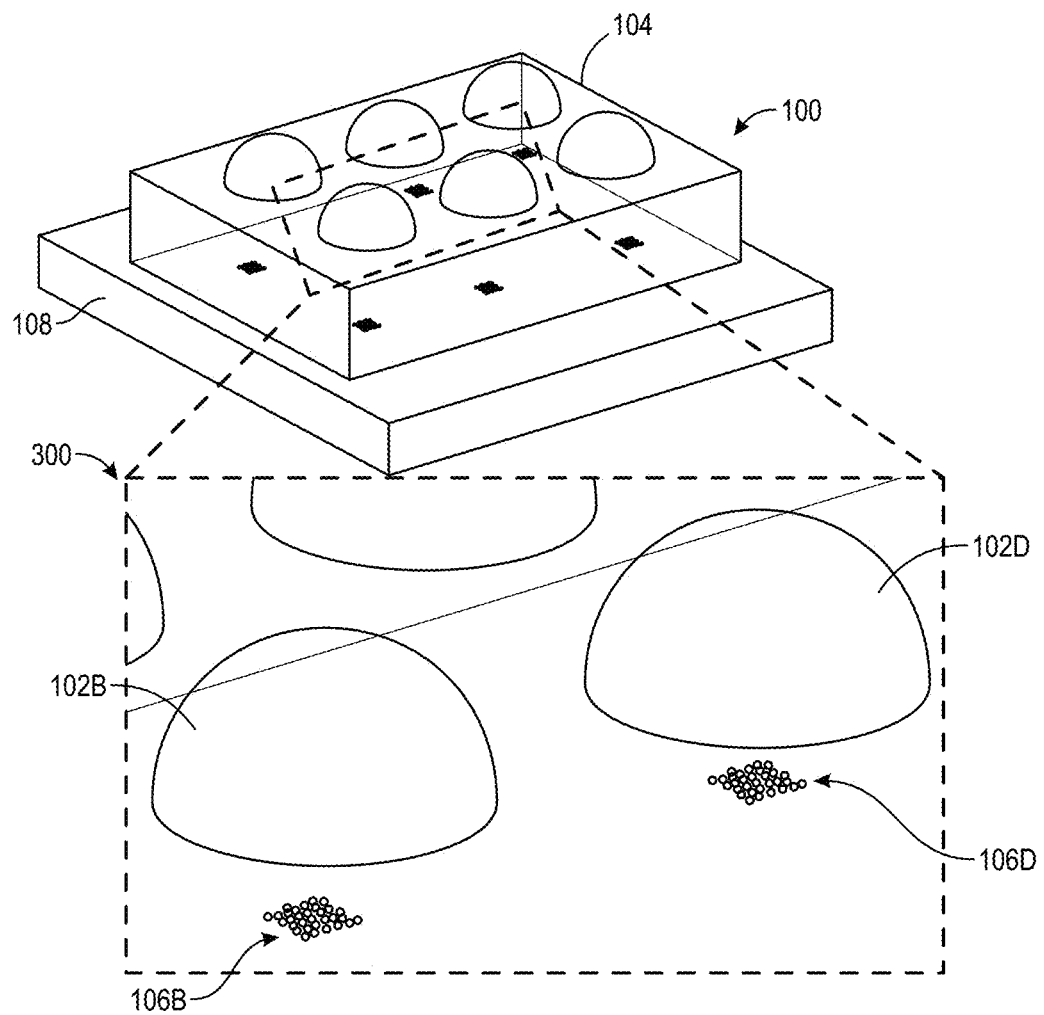
FIG. 3 illustrates a magnified view of a portion of the apparatus of FIG. 1.

FIG. 1 illustrates a low cost solution in which all of the microLEDs of a cluster are placed (electrically connected in either in series or parallel, in a fixed and passive pattern) on the PCB with projection optics attached on the top. FIG. 3 illustrates a magnified view 300 of a portion of the module 100 comprising the substrate 108 and the transparent plate 104, showing in greater detail the arrangement of the LED clusters (specifically LED clusters 106B and 106D, beneath respective micro-lenses (specifically micro-lenses 102B and 102D).

Figure 4:
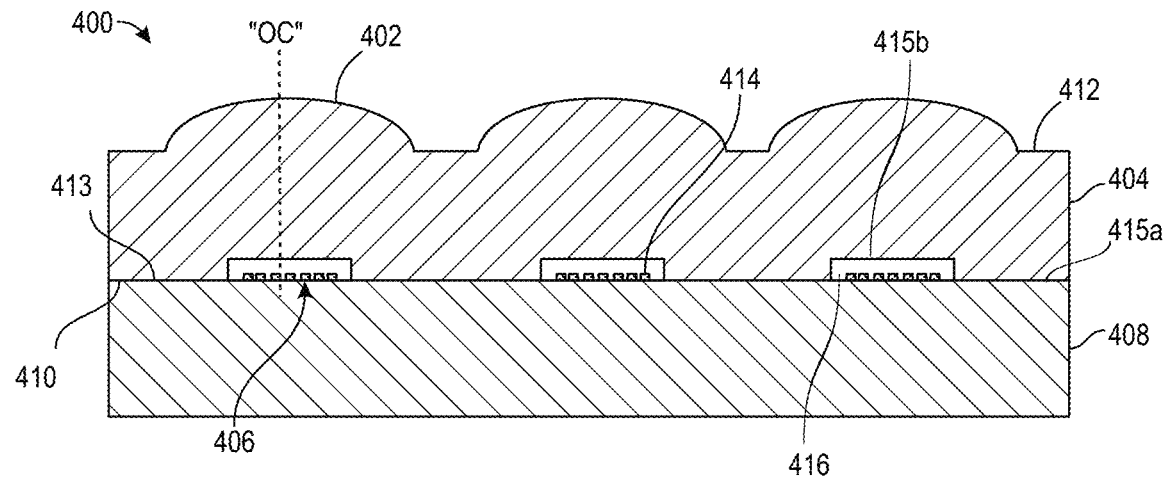
FIG. 4 is a schematic cross-section of a side view of the apparatus in accordance with embodiments described herein.

FIG. 4 is a schematic cross-section of a side view of a LED dot projector module 400. As shown in FIG. 4, the module 400 includes a plurality of micro-lenses, represented in FIG. 4 by a micro-lens 402, disposed on a top surface 412 of a transparent plate 404. The transparent plate 404 is on a substrate 408. LED clusters, represented in FIG. 4 by a LED cluster 406, comprising groups of individual LEDs, represented by a LED 414, are disposed on a top surface 410 of the substrate 408. A center of the LED cluster 406 is off-set from an optical center (OC) of the corresponding micro-lens 402.

An approach to assemble the clusters of LEDS constructed from individual uLEDs is referred to as "pick-and-place" of the individual uLEDs. The pick-and-place (or pick and place) approach includes: picking them up individually and placing them on a substrate according to a desired pattern or design. Thereafter, each individual uLED is attached or adhered to the substrate, for example a printed circuit board. Thereafter, electrical connection are made to control the uLEDs, which may be individually by uLED or by cluster, or as a whole. LEDs may be arranged by a "pick-and-place" method to be off-set relative to the optical center of the micro-lenses. The micro-lens may be designed to accommodate a particular LED cluster design so that one or more centers of the LED clusters are off-set from the optical centers of the micro-lenses.

As shown in FIG. 4, a plurality of cavities, represented in FIG. 4 by cavity 416, are defined in a bottom surface 413 of the plate 404 to accommodate the respective microLED clusters. The cavity 416 may air-filled due to an absence of material. In one or more embodiments, the cavity is filled with a material such as silicone to enhance durability of the device and/or protect the LEDs. As such, the bottom surface 413 of the plate 404 has a primary surface 415a, which is in contact with the top surface 410 of the substrate 408; and a secondary surface 415b, which is not contact with the top surface 410 of the substrate thereby defining the cavity 416. Shape, size, and/or configuration of the cavities may vary according to application. In one or more embodiments, the cavities are designed to provide a focal point of a corresponding micro-lens, and one or more centers of the LED clusters are off-set from the focal point so that a pattern of dots is emitted from the module (rather than a single focused beam of light).

Figure 5:
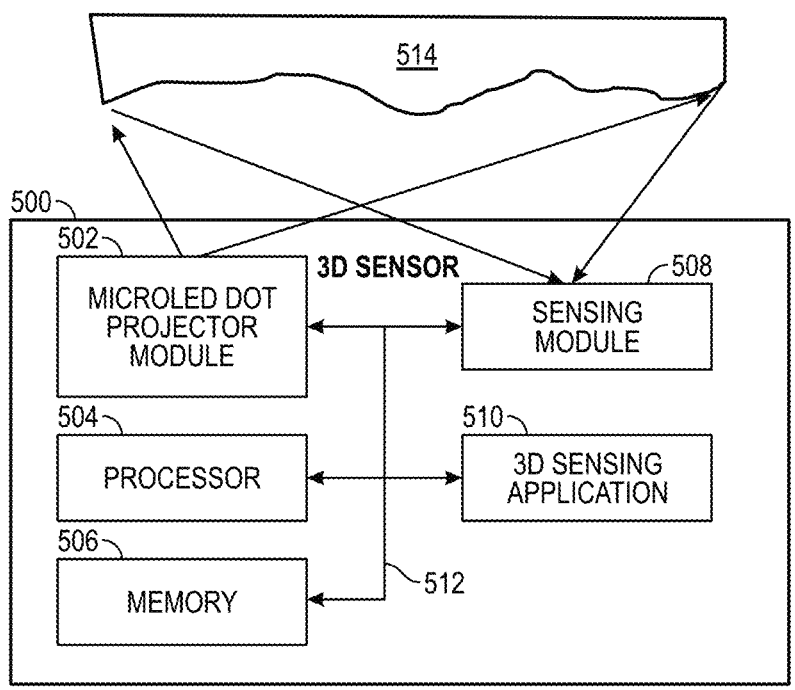
FIG. 5 is a block diagram of 3D sensor using a LED dot projector module in accordance with embodiments described herein.

FIG. 5 is a block diagram of a 3D sensing system 500 employing a microLED dot projector module 502 in accordance with embodiments described herein. As shown in FIG. 5, in addition to the microLED dot projector module 502, the system 500 includes a processor 504, a memory 506, a sensing module 508, and a 3D sensing application 510 interconnected via one or more buses, represented in FIG. 5 by a bus 512. It will be recognized that given the small form factor of the microLED dot projector module 502, as described above, the 3D sensing system 500 may be incorporated into/implemented in any number of different devices, including but not limited to handheld devices such as mobile phones and/or tablets and/or smart watches, for example. Other devices that may benefit from these microLED dot projector modules include automotive displays and/or motorized vehicle driver monitoring systems and/or augmented reality devices and/or virtual reality devices. Exemplary methods of using the system 500 will be described in greater detail with reference to FIGS. 6 and 7. In one or more embodiments, the microLEDs of the dot projector is constructed of infrared (IR) emitting pixels.

In one or more embodiments, a dot projector or illumination system is constructed of a variety of red, green, and blue wavelength emitting pixels. In one or more embodiments, the LED clusters are individually single color monolithic micro displays (e.g., including uLEDs of a single color: e.g., red, green, or blue). In one or more embodiments, the microLEDs include a down-converter material, e.g. layers of a phosphor material, to modify wavelengths and resulting colors being emitted.

Figure 6:
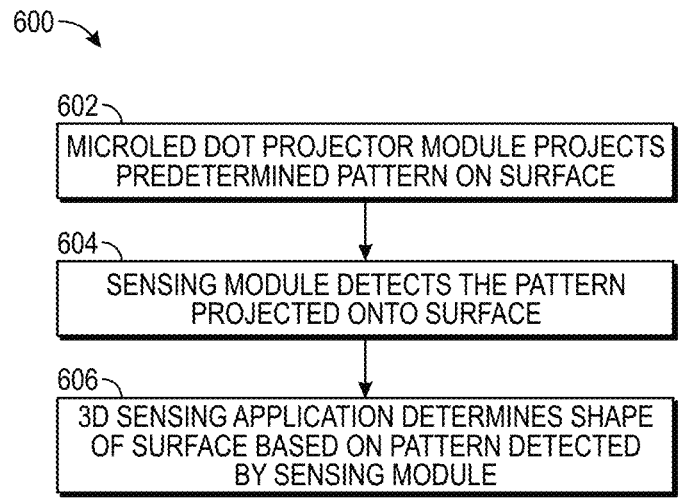
FIG. 6 is a flowchart of example operations of the 3D sensor of FIG. 5 in which the LED dot projector module projects a fixed image.

FIG. 6 illustrates a flowchart 600 of an exemplary method of using the system 500 in which the microLED dot projector module 502 is a static module for projecting a fixed pattern onto a surface 514 (FIG. 5). It should be noted that, while the surface 514 is shown as an irregular surface (e.g., comprising a face), the surface may also be implemented as a flat surface onto which an image may be projected. At operation 602, the microLED dot projector module 502 projects a predetermined pattern onto the surface 514. It will be recognized that the pattern projected by the module 502 will be determined by the number and arrangement of micro-lenses and associated microLED clusters disposed under the micro-lenses. At operation 604, the sensing module 508 detects the pattern projected onto the surface. The sensing module 508 may be implemented using any appropriate device for sensing light reflected from the surface 514 resulting from the image projected thereon by the module 502. In step 606, the 3D sensing application 510, which may comprise instructions executable by the combination of the processor 504 and memory 506, determines the shape of the surface based on a pattern detected by the sensing module 508. It should be noted that, in embodiments in which a fixed image, such as a company logo, is intended to be projected onto a surface for display purposes, steps 604 and 606 (as well as elements 508 and 510 (FIG. 5)) may be omitted.

In an embodiment, apparatus for projecting light onto a projection surface, comprises: a mobile device comprising: a camera, and a LED dot projector module comprising: an array of two or more independently controllable light emitting diode (LED) clusters on a substrate; and two or more micro-lenses, each positioned over the two or more LED clusters, each of the micro-lenses having an optical center; each of the LED clusters being arranged to emit light through each of the micro-lenses in a pattern of dots, and a center of at least one LED cluster is off-set from an optical center of the micro-lens of its LED cluster. In one or more embodiments, the mobile device further comprises a sensing module for detecting the pattern of dots and a 3D sensing application for processing the detected pattern of dots to determine at least one 3D feature of the surface.

Figure 7:
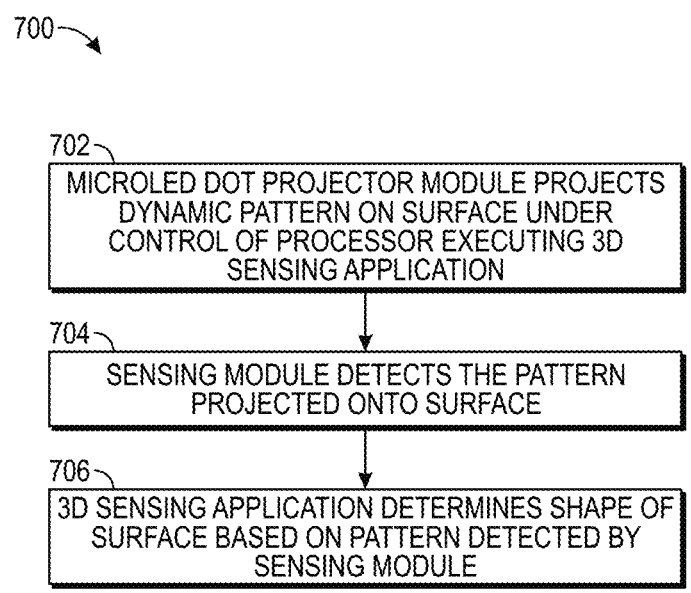
FIG. 7 is a flowchart of example operations of the 3D sensor of FIG. 5 in which the LED dot projector module projects a dynamic image.

FIG. 7 illustrates a flowchart 700 of example operation of the system 500 in which the microLED dot projector module 502 is a dynamic module for projecting a dynamic (e.g., programmable) pattern onto the surface 514. In step 702, the microLED dot projector module 502 projects a dynamic pattern on the surface 514 under control of the processor 504 in combination with the memory 506 executing instructions comprising the 3D sensing application 510. In step 704, the sensing module may detect the pattern projected onto the surface. In step 706, the 3D sensing application may determine the shape of the surface based on a pattern detected by the sensing module 508. As previously noted, in embodiments in which a dynamic image, such as an animated version of a company logo, is intended to be projected onto a surface for display purposes, steps 704 and 706 (as well as elements 508 and 510 (FIG. 5)) may be omitted.

Figure 8:
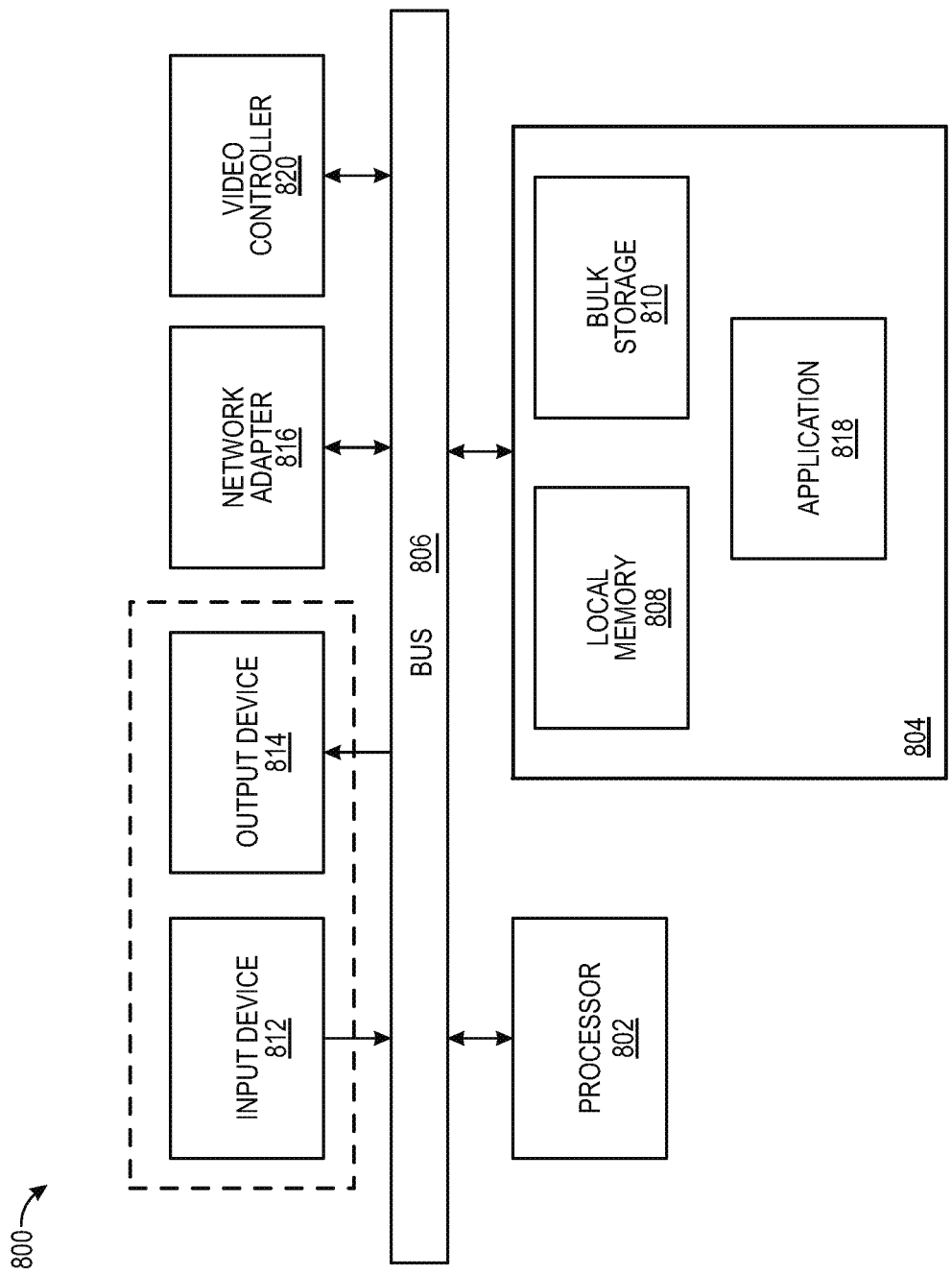
FIG. 8 is a block diagram illustrating an example data processing system that may be configured to implement at least portions of a system including a LED dot projector module in accordance with embodiments described herein.

FIG. 8 is a block diagram illustrating an example data processing system 800 that may be configured to implement at least portions of a microLED dot projector and/or a 3D sensor and/or an illumination system in accordance with embodiments described herein, and more particularly as shown in the figures described hereinabove.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure, such as a smart phone, a smart watch, or a video display system, for example.

In some embodiments, the processor 802 (e.g., processor 504 (FIG. 5)) can execute software or an algorithm (such as the 3D sensing application 510 (FIG. 5)) to perform the activities as discussed in this specification, in particular activities related to a display implemented using microLEDs in accordance with embodiments described herein. The processor 802 may include any combination of hardware, software, or firmware providing programmable logic, including by way of non-limiting example a microprocessor, a DSP, a field-programmable gate array (FPGA), a programmable logic array (PLA), an integrated circuit (IC), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 (e.g., memory 506 (FIG. 5)) may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in the figures described above, can also include suitable interfaces for receiving, transmitting, and/or otherwise communicating data or information in a network environment so that they can communicate with, e.g., the data processing system 800 of another one of these elements.

In certain example implementations, mechanisms for implementing a microLED dot projector and/or 3D sensor as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, a sensing module (such as sensing module 510 (FIG. 5)) or the like. Examples of output devices may include, but are not limited to, a monitor or a display, speakers, a projector (such as microLED dot projector module 502 (FIG. 5)) or the like. In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800. A video controller 820 may also be provided for controlling operation of a display, should one be provided.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, features may be implemented in one or more silicon cores in Application Specific Integrated Circuits (ASICs), Field Programmable Gate Arrays (FPGAs), and other semiconductor chips.

It is also important to note that the functions related to embodiments described herein include only some of the possible functions that may be executed by, or within, the systems described herein. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

EMBODIMENTS

Various embodiments are listed below. It will be understood that the embodiments listed below may be combined with all aspects and other embodiments in accordance with the scope of the invention.

Embodiment (a). An apparatus for projecting light onto a projection surface, the apparatus comprising: a substrate having disposed thereon two or more LED clusters, each LED cluster comprising a plurality of LEDs and a micro-lens disposed over the plurality of LEDs; and each of the LED clusters being arranged to emit light through each of the micro-lenses in a pattern of dots, and a center of at least one LED cluster is off-set from an optical center of the micro-lens of its LED cluster.

Embodiment (b). The apparatus of embodiment (a), wherein each of the micro-lenses is disposed on a top surface of a transparent plate, and a bottom surface of the transparent plate opposite the top surface is on a top surface of the substrate.

Embodiment (c). The apparatus of embodiment (a) or (b), wherein each of the micro-lenses is integral to the top surface of the transparent plate.

Embodiment (d). The apparatus of any one of embodiments (a) to (c), wherein portions of the bottom surface of the transparent plate define cavities for receiving the two or more LED clusters.

Embodiment (e). The apparatus of any one of embodiments (a) to (d), wherein a width of each of the LEDs is greater than or equal to 2 microns and less than or equal to 500 microns.

Embodiment (f). The apparatus of any one of embodiments (a) to (e), wherein for each of the LED clusters, when the LEDs of each of the LED clusters are illuminated, the micro-lens of each LED cluster projects a tile of light onto the projection surface.

Embodiment (g). The apparatus of any one of embodiments (a) to (f), wherein the pattern of dots comprises a fixed pattern.

Embodiment (h). The apparatus of any one of embodiments (a) to (g), wherein each of the LEDs is individually illuminable.

Embodiment (i). The apparatus of any one of embodiments (a) to (h), wherein each of LEDs comprises indium gallium nitride (InGaN) or aluminum indium gallium phosphide (AlInGaP).

Embodiment (j). The apparatus of any one of embodiments (a) to (i), wherein a height of the apparatus is 4 millimeters or less.

Embodiment (k). The apparatus of any one of embodiments (a) to (j), wherein the substrate comprises a printed circuit board (PCB).

Embodiment (l). The apparatus of any one of embodiments (a) to (k), wherein each of the micro-lenses comprises a projection lens.

Embodiment (m). The apparatus of any one of embodiments (a) to (l), wherein each of the LED clusters is independently addressable.

Embodiment (n). An apparatus for projecting light onto a projection surface, the apparatus comprising: a LED dot projector module comprising: a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots, and a center of at least one LED cluster is off-set from an optical center of the micro-lens of its LED cluster; a sensing module for detecting the pattern of dots; and a 3D sensing application for processing the detected pattern of dots to determine at least one 3D feature of the surface.

Embodiment (o). The apparatus of embodiment (n), wherein each of the micro-lenses is disposed on a top surface of a transparent plate, a bottom surface of the transparent plate opposite the top surface is on a top surface of the substrate.

Embodiment (p). The apparatus of embodiment (n) or (o), wherein for each of the LED clusters, when the LEDs of each of the LED clusters are illuminated, the micro-lenses of each LED cluster projects a tile of light onto the projection surface.

Embodiment (q). The apparatus of any one of embodiments (n) to (p), wherein a width of each of the LEDs is greater than or equal to 2 microns and less than or equal to 500 microns.

Embodiment (r). A method of projecting light onto a projection surface, the method comprising: activating an apparatus comprising: a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots, and a center of at least one LED cluster is off-set from an optical center of the micro-lens of its LED cluster; projecting the pattern of dots onto the surface; detecting the projected pattern of dots; and determining at least one 3D feature of the surface using the detected projected pattern of dots.

Embodiment (s). The method of embodiment (r), wherein a width of each of the LEDs is greater than or equal to 2 microns and less than or equal to 500 microns.

Embodiment (t). A method of making an apparatus comprising: placing a plurality of LEDS on a substrate in two or more LED clusters; and arranging a plurality of micro-lenses over each of the two or more LED clusters, each of the micro-lenses having an optical center; a center of at least one of the LED clusters being off-set from the optical center of the micro-lens of its LED cluster.

Embodiment (u). An illumination system comprising: an array of two or more independently controllable light emitting diode (LED) clusters on a substrate; and two or more micro-lenses, each positioned over the two or more LED clusters, each of the micro-lenses having an optical center; each of the LED clusters being arranged to emit light through each of the micro-lenses in a pattern of dots, and a center of at least one LED cluster is off-set from an optical center of the micro-lens of its LED cluster.

Embodiment (v). The illumination system of embodiment (u), wherein each of the micro-lenses is disposed on a top surface of a transparent plate, and a bottom surface of the transparent plate opposite the top surface is on a top surface of the substrate.

Embodiment (w). The illumination system of embodiment (u) or (v), wherein each of the micro-lenses is integral to the top surface of the transparent plate.

Embodiment (x). The illumination system of any one of embodiments (u) to (w), wherein portions of the bottom surface of the transparent plate define cavities for receiving the two or more LED clusters.

Embodiment (y). The illumination system of any one of embodiments (u) to (x), wherein a width of each of the LEDs is greater than or equal to 2 microns and less than or equal to 500 microns.

Embodiment (z). The illumination system of any one of embodiments (u) to (y), wherein for each of the LED clusters, when the LEDs of the LED cluster are illuminated, the micro-lens of each LED cluster projects a tile of light onto the projection surface.

Embodiment (aa). The illumination system of any one of embodiments (u) to (z), wherein the pattern of dots comprises a fixed pattern.

Embodiment (bb). The illumination system of any one of embodiments (u) to (aa), wherein each of the LEDs is individually illuminable.

Embodiment (cc). The illumination system of any one of embodiments (u) to (bb), wherein each of LEDs comprises indium gallium nitride (InGaN) or aluminum indium gallium phosphide (AlInGaP).

Embodiment (dd). The illumination system any one of embodiments (u) to (cc), wherein a height of the apparatus is 4 millimeters or less.

Embodiment (ee). The illumination system of any one of embodiments (u) to (dd), wherein the substrate comprises a printed circuit board (PCB).

Embodiment (ff). The illumination system of any one of embodiments (u) to (ee), wherein each of the micro-lenses comprises a projection lens.

Embodiment (gg). The illumination system of any one of embodiments (u) to (ff), wherein each of the LED clusters is independently addressable.

Embodiment (hh). Any one of embodiments (a) to (gg), wherein each of the LED clusters is off-set from a center of its micro-lens.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

What is claimed is:

1. An apparatus for projecting light onto a projection surface, the apparatus comprising:
   a substrate having disposed thereon two or more LED clusters, each LED cluster comprising a plurality of LEDs and a micro-lens disposed over the plurality of LEDs; and
   each of the LED clusters being arranged to emit light through each of the micro-lenses in a pattern of dots, and a center of at least one LED cluster is off-set from an optical center of the micro-lens of its LED cluster.

2. The apparatus of claim 1, wherein each of the micro-lenses is disposed on a top surface of a transparent plate, and a bottom surface of the transparent plate opposite the top surface is on a top surface of the substrate.

3. The apparatus of claim 2, wherein each of the micro-lenses is integral to the top surface of the transparent plate.

4. The apparatus of claim 2, wherein portions of the bottom surface of the transparent plate define cavities for receiving the two or more LED clusters.

5. The apparatus of claim 1, wherein a width of each of the LEDs is greater than or equal to 2 microns and less than or equal to 500 microns.

6. The apparatus of claim 1, wherein for each of the LED clusters, when the LEDs of each of the LED clusters are illuminated, the micro-lens of each LED cluster projects a tile of light onto the projection surface.

7. The apparatus of claim 1, wherein the pattern of dots comprises a fixed pattern.

8. The apparatus of claim 1, wherein each of the LEDs is individually illuminable.

9. The apparatus of claim 1, wherein each of LEDs comprises indium gallium nitride (InGaN) or aluminum indium gallium phosphide (AlInGaP).

10. The apparatus of claim 1, wherein a height of the apparatus is 4 millimeters or less.

11. The apparatus of claim 1, wherein the substrate comprises a printed circuit board (PCB).

12. The apparatus of claim 1, wherein each of the micro-lenses comprises a projection lens.

13. The apparatus of claim 1, wherein each of the LED clusters is independently addressable.

14. An apparatus for projecting light onto a projection surface, the apparatus comprising:
   a LED dot projector module comprising:
      a substrate having disposed thereon two or more LED clusters, each LED cluster comprising a plurality of LEDs and a micro-lens disposed over the plurality of LEDs; and
      each of the pluralities of LEDs being arranged to emit light through each of the micro-lenses in a pattern of dots, and a center of at least one LED cluster is off-set from an optical center of the micro-lens of its LED cluster;
   a sensing module for detecting the pattern of dots; and
   a 3D sensing application for processing the detected pattern of dots to determine at least one 3D feature of the surface.

15. The apparatus of claim 14, wherein each of the micro-lenses is disposed on a top surface of a transparent plate, a bottom surface of the transparent plate opposite the top surface is on a top surface of the substrate.

16. The apparatus of claim 14, wherein for each of the LED clusters, when the LEDs of each of the LED clusters are illuminated, the micro-lenses of each LED cluster projects a tile of light onto the projection surface.

17. The apparatus of claim 14, wherein a width of each of the LEDs is greater than or equal to 2 microns and less than or equal to 500 microns.

18. A method of projecting light onto a projection surface, the method comprising:
   activating an apparatus comprising:
      a substrate having disposed thereon two or more LED clusters, each LED cluster comprising a plurality of LEDs and a micro-lens disposed over the plurality of LEDs; and each of the pluralities of LEDs being arranged to emit light through each of the micro-lenses in a pattern of dots, and a center of at least one LED cluster is off-set from an optical center of the micro-lens of its LED cluster;
   projecting the pattern of dots onto the surface;
   detecting the projected pattern of dots; and determining at least one 3D feature of the surface using the detected projected pattern of dots.

19. The method of claim 18, wherein a width of each of the LEDs is greater than or equal to 2 microns and less than or equal to 500 microns.

20. A method of making an apparatus comprising:

placing a plurality of LEDS on a substrate in two or more LED clusters; and arranging a plurality of micro-lenses over each of the two or more LED clusters, each of the micro-lenses having an optical center;

a center of at least one of the LED clusters being off-set from the optical center of the micro-lens of its LED cluster.

* * * * *